United States Patent [19]
Kato et al.

[11] Patent Number: 5,237,639
[45] Date of Patent: Aug. 17, 1993

[54] OPTICAL WAVEGUIDE FORMED OF COMPOUND SEMICONDUCTOR MATERIALS AND PROCESS OF FABRICATING THE OPTICAL WAVEGUIDE

[75] Inventors: Tomoaki Kato; Keiro Komatsu; Tatsuya Sasaki, all of Tokyo, Japan

[73] Assignee: NEC Corporation, Tokyo, Japan

[21] Appl. No.: 822,135

[22] Filed: Jan. 17, 1992

[30] Foreign Application Priority Data

Jan. 17, 1991 [JP] Japan .................... 3-019411

[51] Int. Cl.⁵ .................... G02B 6/12; H01S 3/18; H01L 21/70
[52] U.S. Cl. .................... 385/131; 385/14; 385/130; 372/43; 372/50; 372/44; 437/51; 437/129
[58] Field of Search .............. 385/14, 129, 130, 131, 385/132; 372/43, 44, 48, 50, 96, 102; 437/36, 51, 130, 129, 131, 133, 150

[56] References Cited

U.S. PATENT DOCUMENTS

| | | | |
|---|---|---|---|
| 3,984,173 | 10/1976 | Shaw | 385/131 |
| 4,121,179 | 10/1978 | Chinone et al. | 372/45 |
| 4,585,299 | 4/1986 | Strain | 385/14 |
| 4,845,724 | 7/1989 | Hayakawa et al. | 372/45 |
| 4,896,328 | 1/1990 | Sekiguchi et al. | 372/45 |
| 4,980,895 | 12/1990 | Nishimura | 372/45 |
| 5,059,552 | 10/1991 | Harder et al. | 437/129 |
| 5,179,615 | 1/1993 | Tanaka et al. | 385/131 |

OTHER PUBLICATIONS

Hiroaki Takeuchi and Kunishige O. E., "Low-Loss Single-Mode GaAs/AlGaAs Miniature Optical Waveguides with Straight and Bending Structures," *Journal of Lightwave Technology*, Jul. 7, 1989.

Primary Examiner—Brian Healy
Attorney, Agent, or Firm—Sughrue, Mion, Zinn, Macpeak & Seas

[57] ABSTRACT

An optical waveguide is fabricated on a substrate of n-type indium phosphide, and comprises a guiding layer of intentionally undoped indium gallium arsenide sandwiched between lower and upper cladding layers of intentionally undoped indium phosphide, wherein the upper cladding layer has a ridge epitaxially grown on a part of an upper surface of the upper cladding layer so that the optical waveguide achieves low propagation losses.

19 Claims, 6 Drawing Sheets

OPTICAL WAVEGUIDE FORMED OF COMPOUND SEMICONDUCTOR MATERIALS AND PROCESS OF FABRICATING THE OPTICAL WAVEGUIDE

FIELD OF THE INVENTION

This invention relates to an optical waveguide formed of compound semiconductor materials and, more particularly, to an optical waveguide with a ridge structure.

DESCRIPTION OF THE RELATED ART

Research and development efforts have been made on an optical waveguide with a ridge structure which is preferable for low-loss optical propagation paths of an integrated optical circuits. A typical example of the optical waveguide is disclosed by Hiroaki Takeuchi et. al. in "Low-Loss Single-Mode GaAs/AlGaAs Miniature Optical Waveguides with Straight and Bending Structures", 1989 IEEE, Journal of Lightwave Technology, July 1989, vol. 7, No. 7, pages 1044 to 1053. Takeuchi et. al. fabricate the optical guide on an n-type gallium arsenide substrate. Using a molecular beam epitaxy, a lower cladding layer of $Al_{0.3}Ga_{0.7}As$, a guiding layer of GaAs and an upper cladding layer of $Al_{0.3}Ga_{0.7}As$ are sequentially grown on the n-type gallium arsenide substrate through a molecular beam epitaxy, and the upper cladding layer is shaped into a ridge structure by using an RIBE dry etching technique associated with a lithography.

The optical waveguides thus fabricated provide straight and bending optical propagation paths between active and/or passive elements such as semiconductor laser diodes, photo-diodes, optical filter elements and optical couplers.

In the anisotropic reactive ion etching, chlorine containing gaseous mixture is available for gallium arsenide and aluminum gallium arsenide as reported by Hirohito Yamada et. al. in "Anisotropic ion etching technique of GaAs and ALGaAs materials for integrated optical device fabrication", 1985 American Vacuum Society, J. Vac. Sci. Technol. B3(3), May/June 1985, pages 884 to 888. According to the paper, the etching rate is controllable by adjusting the gas composition and the total gas pressure in the gaseous mixture, and the gaseous mixture of chlorine and argon provides the optimum conditions at the flow rate of $Cl_2: Ar = 1:5$ at the total gas pressure of 2 Pa.

In the circumstances, the optical waveguides in the GaAs/ AlGaAs system are incorporated in various optical devices such as optical demultiplexers, optical couplers and optical switches.

Optical devices in the InP/ InGaAs system a e preferable for an optical fiber transmission system to 1.3 micron to 1.5 micron wavelength. However, the prior art technology is hardly applicable to the optical device in the InP/ InGaAs system and an integrated optical circuit in the InP/ InGaAs system. This is because of the fact that the chlorine containing gaseous mixture or the etchant used in the anisotropic reactive ion etching process roughs the exposed surface of the upper cladding layer of InGaAs with the ridge structure due to chlorides left on the exposed surface. The rough surface deteriorates the propagation characteristics of the optical waveguide, and any practical optical waveguide in the InP/ InGaAs system has not been available yet.

SUMMARY OF THE INVENTION

It is therefore an important object of the present invention to provide an optical waveguide which is preferable for a range of wavelength different from that of the optical waveguide in the GaAs/ AlGaAs system.

It is also an important object of the present invention to provide a fabrication process which is applicable to an optical waveguide in a compound semiconductor system different from the GaAs/ AlGaAs system.

To accomplish the object, the present invention proposes to form a ridge of an upper cladding layer through an epitaxial growth.

In accordance with one aspect of the present invention, there is provided an optical waveguide fabricated on a substrate of a first compound semiconductor material, comprising a slab line having a) an upper cladding layer with a ridge epitaxially grown on a part of an upper surface thereof defined by a mask layer.

The slab line may be formed of compound semiconductor materials in the InP/InGaAs system.

In accordance with another aspect of the present invention, there is provided a process of fabricating an optical waveguide, comprising the steps of: a) preparing a substrate of a first compound semiconductor material; b) sequentially growing a second compound semiconductor material, a third compound semiconductor material and a fourth compound semiconductor material on the substrate for providing an optical guiding layer sandwiched between a lower cladding layer and an upper cladding layer; c) providing a mask layer of dielectric substance on an upper surface of the upper cladding layer having an opening exposing a part of the upper surface; and d) epitaxially growing the fourth compound semiconductor material on the part of the upper surface for producing a ridge.

BRIEF DESCRIPTION OF THE DRAWINGS

The feature and advantages of the optical waveguide and the process of fabrication thereof according to the present invention will be more clearly understood from the following description taken in conjunction with the accompanying drawings in which.

DESCRIPTION OF THE PREFERRED EMBODIMENTS

First Embodiment

An optical waveguide embodying the present invention is fabricated on a substrate of n-type indium-phosphide, and is of the slab line. The optical waveguide implementing the first embodiment comprises an optical guiding layer of indium-gallium-arsenide sandwiched between a lower cladding layer of indium-phosphide and an upper cladding layer of indium-phosphide, and the upper cladding layer has a ridge on the upper surface thereof. The indium-phosphide and the indium-gallium-arsenide are hereinbelow abbreviated as InP and InGaAs, respectively.

Figure 1A:
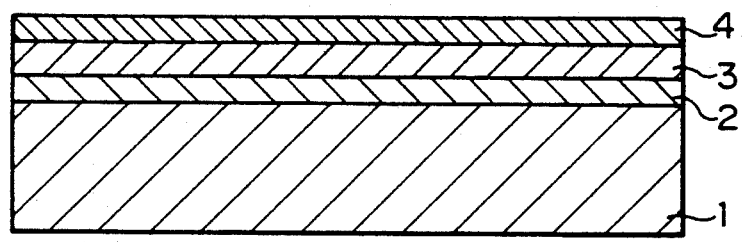
FIGS. 1A to 1C are cross sectional views showing a process sequence for fabricating an optical waveguide according to the present invention.
Figure 1B:
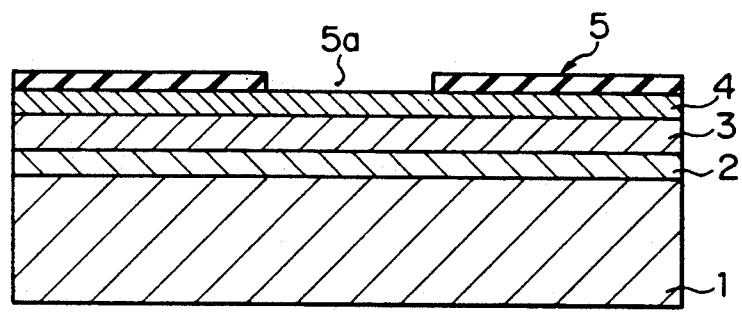
Figure 1C:
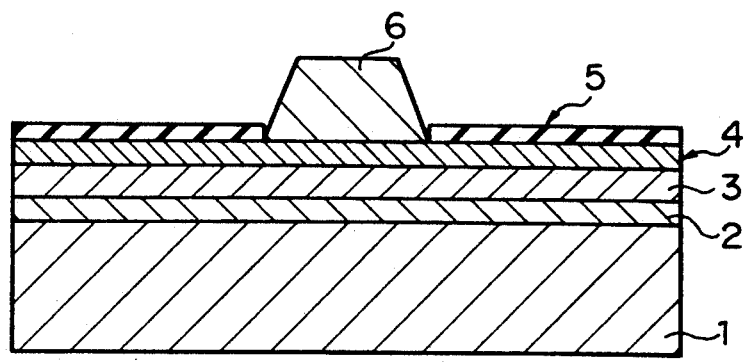

Description is made on a process sequence for fabricating the optical waveguide embodying the present invention with reference to FIGS. 1A to 1C. The process sequence starts with preparation of an n-type substrate 1 of InP. On the n-type InP substrate 1 are successively grown an intentionally undoped InP film 2, an intentionally undoped InGaAs film 3 and an intentionally undoped InP film 4 which respectively serve as a lower cladding layer, an optical guiding layer and an upper cladding layer. The intentionally undoped InP film 2, the intentionally undoped InGaAs film 3 and the intentionally undoped InP film 4 are sequentially grown through a molecular beam epitaxy or a metalorganic vapor phase epitaxy, and, for this reason, the thickness of the upper cladding layer is precisely controllable. The intentionally undoped InP film 2 is grown to thickness of about 0.1 micron, and the intentionally undoped InP film 4 is grown to thickness of about 0.2 micron. The intentionally undoped InGaAs film 3 is about 0.3 micron in thickness, and is larger in refractive index than the intentionally undoped InP films 2 and 4 The optical guiding layer formed of the intentionally undoped InGaAs film 3 has wavelength composition of about 1.15 micron, and is expected to effectively propagate light. The resultant structure of this stage is shown in FIG. 1A.

Silicon dioxide is deposited on the intentionally undoped InP film 4 to a predetermined thickness, and an opening 5a is formed in the silicon dioxide film 5 through lithographic techniques. If the silicon dioxide film 5 of several angstroms is provided on the intentionall undoped InP film 4, the silicon dioxide film 5 is effective against selective growth carried out at a later stage. However, the silicon dioxide film 5 is grown to about 800 angstroms. A part of upper surface of the intentionally undoped InP film 4 is exposed through the quadrilateral opening 5a. In this instance, the opening 5a is quadrilateral, and is as narrow as about 3 microns. However, the opening may be of a bending opening. The resultant structure of this stage is shown in FIG. 1B.

Intentionally undoped InP is epitaxially grown on the exposed upper surface of the intentionally undoped InP film 4 through a metalorganic vapor phase epitaxy abbreviated as MOVPE. The intentionally undoped InP thus epitaxially grown serves as a ridge structure, and the resultant structure is shown in FIG. 1C. In the following description, the lower cladding layer, the optical guiding layer, the upper cladding layer and the ridge structure are labeled with references designating the compound semiconductor films 2, 3, 4 and 6, respectively. The optical guiding layer 3 sandwiched between the lower and upper cladding layers 2 and 4 form in combination a slab line.

The optical waveguide thus fabricated propagates light along the longitudinal direction of the ridge structure 6. Namely, the lower and upper cladding layers 2 and 4 vertically confine the light to the optical guiding layer 3 by virtue of the difference in the refractive index between the intentionally undoped InP and the intentionally undoped InGaAs. Since the optical guiding layer 3 under the ridge structure 6 is larger in the effective refractive index than both sides thereof, the light is laterally confined to the optical guiding layer 3 under the ridge structure 6, and is, accordingly, propagated along the longitudinal direction of the ridge structure 6, In other words, the optical guiding layer 3 under the ridge structure 6 serves as a three-dimensional optical path guiding light along the ridge structure.

The process sequence implementing the first embodiment forms the ridge structure without any dry etching technique. The upper surface of the upper cladding layer 4 as well as the side surfaces of the ridge structure 6 are so smooth that the optical waveguide can propagate the light with extremely small scattering losses. The width of the ridge structure 6 is defined by the width of the opening 5a, and the width of the opening 5a is precisely adjustable because of the lithographic process. In other words, the process according to the present invention is advantageous over the prior art process in miniaturization, and is, accordingly, preferable for a large scale integration.

Moreover, the propagation characteristics of the optical waveguide are highly controllable. In general, the thickness of the ridge structure 6 has influence on the propagation characteristics, and the metalorganic vapor phase epitaxy is desirable for precise control of the film thickness. As described hereinbefore, the process sequence embodying the present invention employs the metalorganic vapor phase epitaxy which can precisely adjust the thickness of the ridge structure 6 to a target value. For this reason, the optical propagation characteristics of the optical waveguide are highly controllable.

The present inventors evaluated the optical propagation characteristics. A comparative example was fabricated from similar compound semiconductor films to those of the optical waveguide implementing the first embodiment, and the ridge structure of the comparative example was patterned by using the dry etching similar to the prior art optical waveguide. Another comparative example was further fabricated, and the ridge structure thereof was patterned through a wet etching. The propagation losses of the first comparative example were of the order of 2 dB/cm, and the second comparative example using the wet etching achieved about 0.26 dB/cm. However, the optical waveguide implementing the first embodiment achieved about 0.2 dB/cm, and the present inventors confirmed that the propagation losses of the first embodiment were smaller than those of the comparative examples.

Second Embodiment

Figure 2:
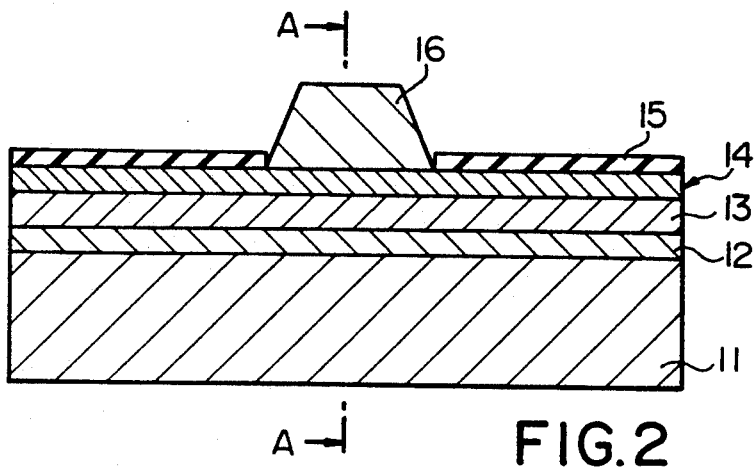
FIG. 2 is a cross sectional view showing the structure of another optical waveguide serving as an optical filter according to the present invention.
Figure 3:
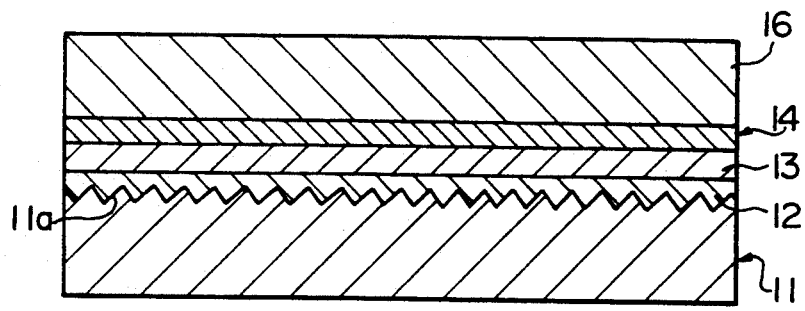
FIG. 3 is a cross sectional view taken along line A—A of FIG. 2 and showing the structure of the optical filter from a different angle.

Turning to FIGS. 2 and 3 of the drawings, an optical filter embodying the present invention is fabricated on an n-type InP substrate 11 having a diffraction grating 11a with period of about 2400 angstroms. On the n-type InP substrate is grown a lower cladding layer 12 of intentionally undoped InGaAs to thickness of about 0.1 micron along the diffraction grating 11a. An optical guiding layer 13 of intentionally undoped InGaAs and an upper cladding layer of intentionally undoped InP are sequentially grown on the lower cladding layer 12 to respective thicknesses of 0.3 micron and 0.2 micron, and a mask layer 15 of silicon dioxide is patterned on the upper surface of the upper cladding layer 14. The mask layer 15 has a quadrilateral opening, and exposes a part of the upper surface of the upper cladding layer 14. A ridge 16 of intentionally undoped InP is epitaxially grown on the exposed upper surface of the upper cladding layer 14, and the optical guiding layer 13 sandwiched between the lower cladding layer 12 and the upper cladding layer 14 with the ridge 16 forms a slab line for propagating light. In this instance, the optical guiding layer has wavelength composition of about 1.15 micron. Since the n-type InP substrate 11 has the diffraction grating 11a, the slab line not only propagates light but also serves as an optical filter.

The optical filter implementing the second embodiment is fabricated through a similar process sequence to the first embodiment, and no further description is incorporated hereinbelow for the sake of simplicity.

Third Embodiment

Figure 4:
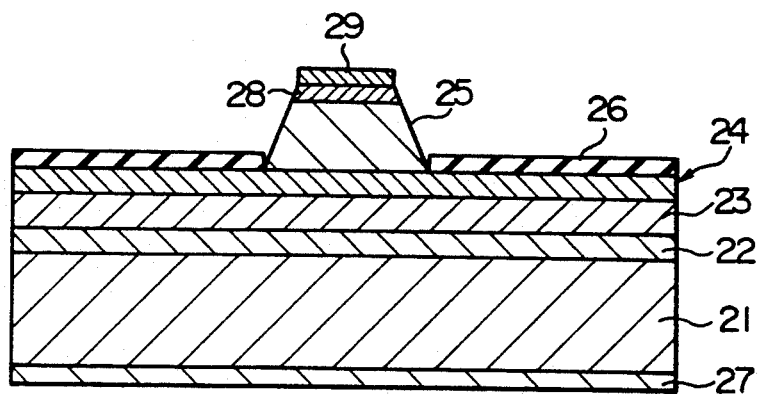
FIG. 4 is a cross sectional view showing the structure of an optical phase shifter according to the present invention.

Turning to FIG. 4, an optical phase shifter embodying the present invention is fabricated on an n-type InP substrate 21, and comprises a lower cladding layer 22 of n-type InP, an optical guiding layer 23 of intentionally undoped InGaAs, and an upper cladding layer 24 of p-type InP with a ridge 25 epitaxially grown on a part of the upper surface thereof defined by a mask layer 26 of silicon dioxide. An electrode 27 of titanium-gold alloy is formed on the bottom surface of the n-type InP substrate 21, and a contact layer 28 is provided between the upper surface of the ridge 25 and an electrode 29 of titanium-gold alloy.

A process for fabricating the optical phase shifter is similar to that shown in FIGS. 1A to 1C, and starts with preparation of the n-type InP substrate 21. On the n-type InP substrate 21 are sequentially grown the n-type InP, the intentionally undoped InGaAs and the p-type InP to respective thicknesses of 0.1 micron, 0.3 micron and 0.2 micron which serve as the lower cladding layer 22, the optical guiding layer 23 and the upper cladding layer 24, respectively. A silicon dioxide film is deposited on the upper cladding layer 23, and is, then, patterned so that the mask layer 26 is provided. The p-type InP is epitaxially grown on the upper surface of the upper cladding layer 24 exposed through a quadrilateral opening of the mask layer 26. The optical guiding layer 23 has wavelength component of about 1.3 micron, and the lower cladding layer 22, the guiding layer 23 and the upper cladding layer 24 with the ridge 25 form in combination a slab line for propagating light.

Heavily doped p-type InGaAs is selectively grown on the upper surface of the ridge 25 so that the contact layer 28 is formed on the ridge 25. The titanium-gold alloy is deposited on the contact layer 28 and on the bottom surface of the n-type InP substrate 21 so as to form the electrodes 29 and 27. The optical phase shifter thus fabricated is about 2 millimeters in length, and an entrance edge surface and an outgoing edge surface are covered with low reflectance coating films (not shown). When current is injected to the optical guiding layer 23, a plasma effect of carriers takes place, and the refractive index of the optical guiding layer 23 is decreased. For this reason, the slab line serves as the optical phase shifter.

Fourth Embodiment

Figure 5:
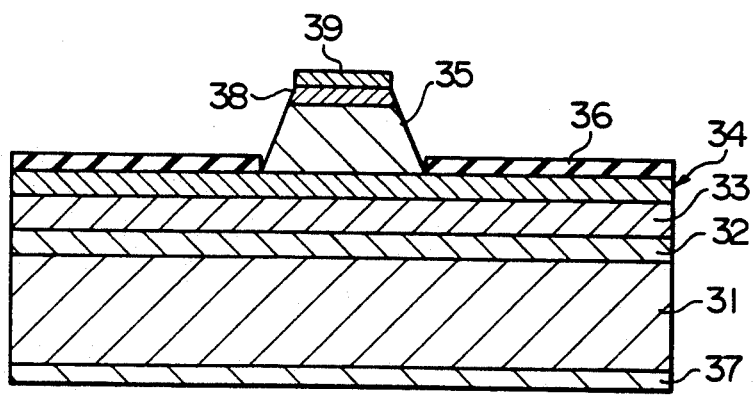
FIG. 5 is a cross sectional view showing the structure of an optical modulator according to the present invention.

Turning to FIG. 5 of the drawings, an optical modulator embodying the present invention is fabricated on an n-type InP substrate 31, and comprises a lower cladding layer 32 of n-type InP, an optical absorbing layer 33 of intentionally undoped InGaAs, and an upper cladding layer 34 of p-type InP with a ridge 25 epitaxially grown on a part of the upper surface thereof defined by a mask layer 36 of silicon dioxide. An electrode 37 of titanium-gold alloy is formed on the bottom surface of the n-type InP substrate 31, and a contact layer 38 is provided between the upper surface of the ridge 35 and an electrode 39 of titanium-gold alloy.

A process for fabricating the optical modulator is similar to that shown in FIGS. 1A to 1C, and starts with preparation of the n-type InP substrate 31. On the n-type InP substrate 31 are sequentially grown the n-type InP, the intentionally undoped InGaAs and the p-type InP to respective thicknesses of 0.1 micron, 0.3 micron and 0.2 micron which serve as the lower cladding layer 32, the optical absorbing layer 33 and the upper cladding layer 34, respectively. A silicon dioxide film is deposited on the upper cladding layer 34, and is, then, patterned so that the mask layer 36 is provided. The p-type InP is epitaxially grown on the upper surface of the upper cladding layer 34 exposed through a quadrilateral opening of the mask layer 36. The optical absorbing layer 33 has wavelength component of about 1.45 microns, and the lower cladding layer 32, the optical absorbing layer 33 and the upper cladding layer 34 with the ridge 35 form in combination a slab line for light.

Heavily doped p-type InGaAs is selectively grown on the upper surface of the ridge 35 so that the contact layer 38 is formed on the ridge 35. The titanium-gold alloy is deposited on the contact layer 38 and on the bottom surface of the n-type InP substrate 31 so as to form the electrodes 39 and 37. The optical modulator thus fabricated is about 300 microns in length, and an entrance edge surface and an outgoing edge surface are covered with low reflectance coating films (not shown). When electric field is applied to the optical absorbing layer 33, the Franz-Keldysh effect takes place, and the basis absorbing edge is shifted to the long-wavelength side. The results in that the absorbing losses for light with wavelength of 1.55 microns are increased, and the slab line serves as an optical modulator.

Fifth Embodiment

Figure 6:
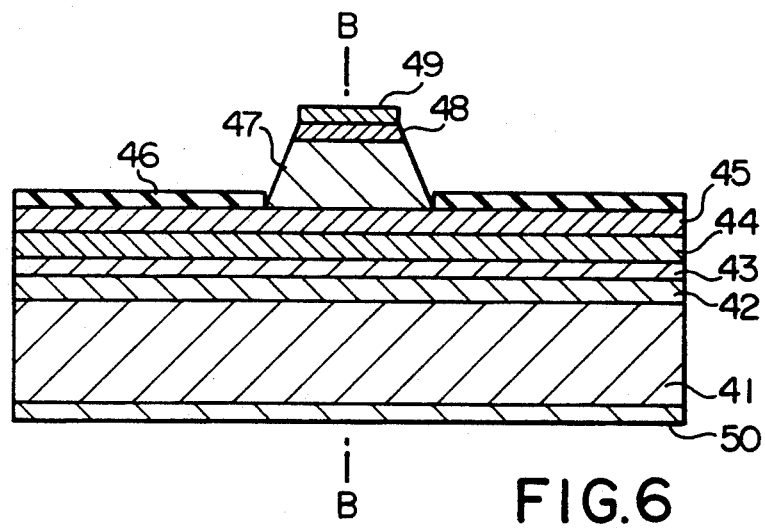
FIG. 6 is a cross sectional view showing the structure of a distributed feedback laser emitting device according to the present invention.
Figure 7:
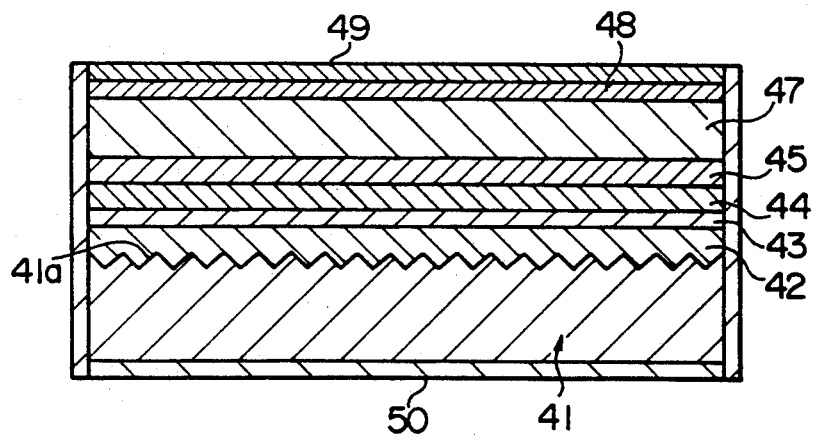
FIG. 7 is a cross sectional view taken along line B—B of FIG. 6 and showing the structure from a different angle.

Turning to FIGS. 6 and 7 of the drawings, a distributed feedback laser emitting device embodying the present invention is fabricated on an n-type InP substrate 41 having a diffraction grating 41a with period of about 2400 angstroms. On the n-type InP substrate 41 are successively grown an optical guiding layer 42 of n-type indium-gallium-arsenic-phosphide (abbreviated as InGaAsP) with wavelength composition of about 1.15 microns, an n-type InP film for a spacer layer 43, an intentionally undoped InGaAsP film with wavelength composition of about 1.55 microns for an active layer 44 and a p-type InP film for a cladding layer 45 which are about 0.3 micron thick, about 0.1 micron thick, about 0.2 micron thick and about 0.3 micron thick, respectively. The optical guiding layer 42, the spacer layer 43, the active layer 44 and the cladding layer 45 form in combination a slab line. A mask layer 46 of silicon dioxide is provided on the upper surface of the cladding layer 45, and a ridge 47 of p-type InP is epitaxially grown on the upper surface through an opening formed in the mask layer 46. A contact layer 48 of heavily doped p-type InGaAs is further grown on the ridge 47, and electrodes 49 and 50 are respectively deposited on the contact layer 48 and the bottom surface of the n-type InP substrate 41 as similar to the third embodiment.

If current is injected to the active layer 44, oscillation takes place, and laser radiation is produced. Thus, the slab line shown in FIG. 7 serves as a distributed feedback laser emitting device.

Sixth Embodiment

Figure 8:
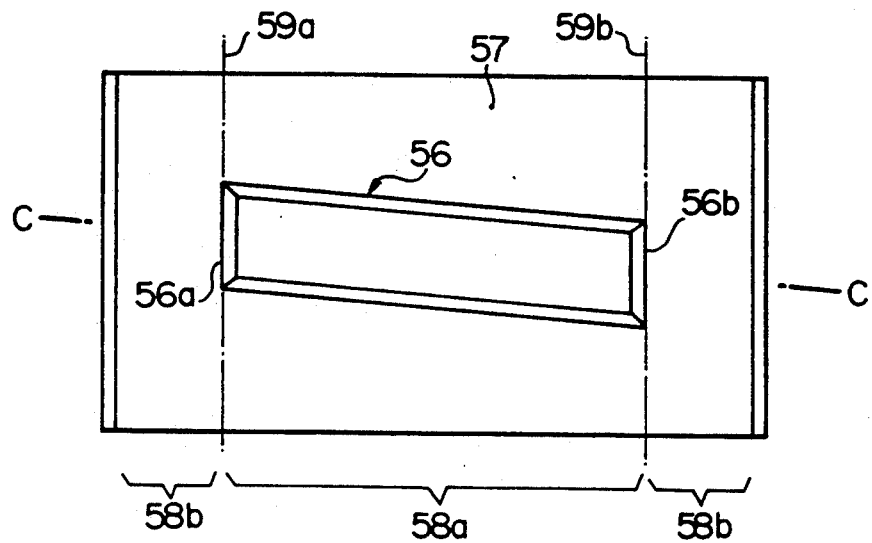
FIG. 8 is a plain view showing the lay out of an optical amplifier according to the present invention.
Figure 9:
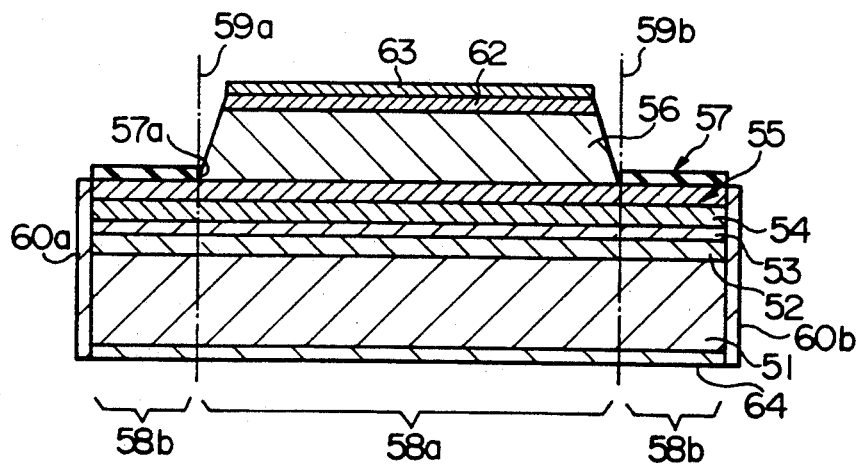
FIG. 9 is a cross sectional view taken along line C—C and showing the structure of the optical amplifier shown in FIG. 8.

Turning to FIGS. 8 and 9 of the drawings, an optical amplifier embodying the present invention is illustrated. The optical amplifier implementing the sixth embodiment is fabricated on an n-type InP substrate 51, and comprises a slab line. The slab line is constituted by an optical guiding layer 52 of n-type InGaAsP, a spacer layer 53 of n-type InP, an active layer 54 of intentionally undoped InGaAsP, and a cladding layer 55 with a ridge 56 formed of p-type InP. In this instance, the optical guiding layer 52, the spacer layer 53, the active layer 54 and the cladding layer 55 are about 0.3 micron thick, about 0.1 micron thick, about 0.2 micron thick and about 0.3 micron thick, respectively. The optical guiding layer 52 has wavelength composition of about 1.15 micron, and the active layer 54 has wavelength composition of about 1.55 micron The cladding layer 55 is covered with a mask layer 57 of silicon dioxide, and a quadrilateral opening 57a is formed in the mask layer 57. In this instance, the quadrilateral opening 57a is of the parallelogram, and expose a part of the upper surface of the cladding layer 55. The ridge 56 is epitaxially grown from the part of the upper surface through the quadrilateral opening 57a, and the side edges 56a and 56b of the ridge 56 define a ridge section 58a of the slab line. On both sides of the ridge area 58a, window sections 58b spread as divided by virtual plains 59a and 59b. The side surfaces of the slab line are covered with low reflectance coating films 60a and 60b, and the virtual plane 59a or 59b is spaced apart from the associated low reflectance coating film 60a or 60b by 25 microns. In other words, each of the window sections 58b is about 25 microns in width. The quadrilateral opening 57a and, accordingly, the ridge 56 obliquely extend at about 6 degrees with respect to (011) orientation of the n-type InP substrate 51, and are about 3 microns in width. A contact layer of heavily doped n-type InGaAs is grown on the upper surface of the ridge 56, and electrodes of titanium-bold alloy are formed on the contact layer 62 and on the bottom surface of the n-type InP substrate 51, respectively.

Figure 10:
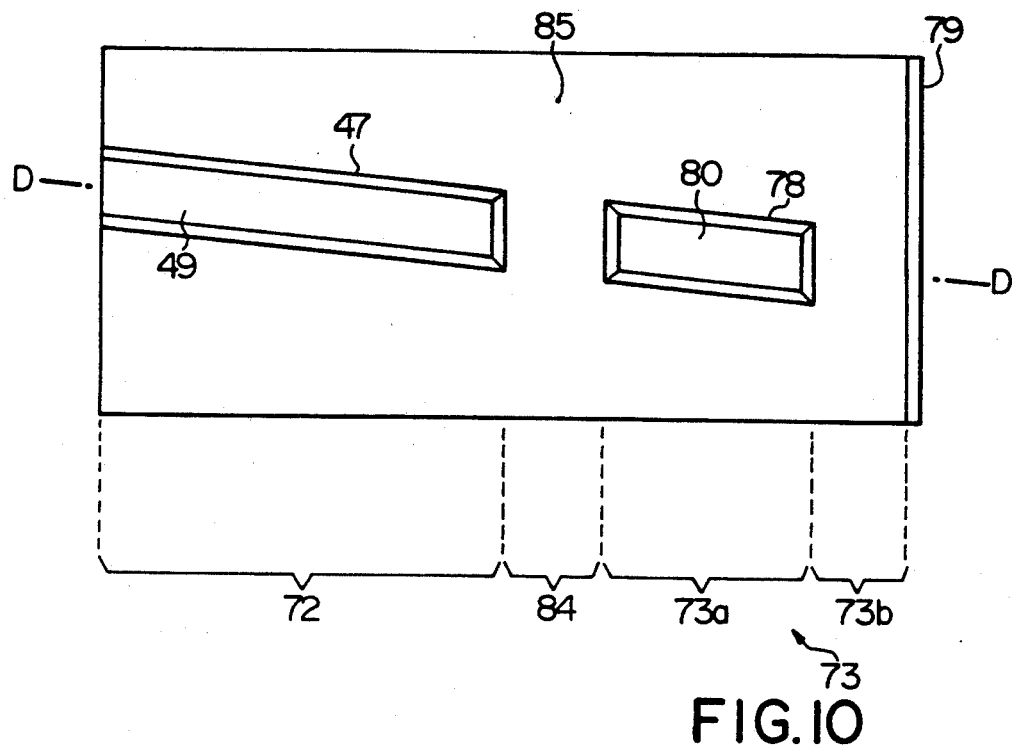
FIG. 10 is a plane view showing the layout of an integrated optical circuit according to the present invention.

The optical amplifier shown in FIGS. 9 and 10 is fabricated as follows. The n-type InP substrate 51 is firstly prepared, and the n-type InGaAsP for the optical guiding layer 52, the n-type InP for the spacer layer 53, the intentionally undoped InGaAsP for the active layer 54, and the p-type InP for the cladding layer 55 are sequentially grown on the n-type InP substrate 51. Silicon dioxide is deposited over the entire surface of the cladding layer 55, and the silicon dioxide film is patterned through lithographic techniques so that the quadrilateral opening 57a is formed therein. The p-type InP is epitaxially grown on the exposed upper surface of the cladding layer 55 through the quadrilateral opening 57a, and similar stages for the third embodiment follows so as to form the contact layer 62, the electrodes 63 and 64 and the low reflectance coating films 60a and 60b.

When current is injected to the active layer 54, the window sections 58b restrict the internal optical resonance, and the optical amplifier achieves excellent gain hardly fluctuating due to variation of wavelength. In detail, if light enters the window sections 58b from the ridge section 58a, the light is not confined because of the absence of the ridge 56, and is gently radiated. Since the light gently radiated is not vertically incident on the side surfaces, the effective reflectance in view of light fed back to the ridge section 58a is less than 0.1 per cent, and the small reflectance at the side surfaces achieves the stable gain. The present inventors confirmed that the ridge obliquely extending at least 5 degrees with respect to the normal line of the incidence/out going surfaces of the substrate, i.e., the side surfaces, as well as the window section were effective against the reflection on the side surfaces.

Seventh Embodiment

Figure 11:
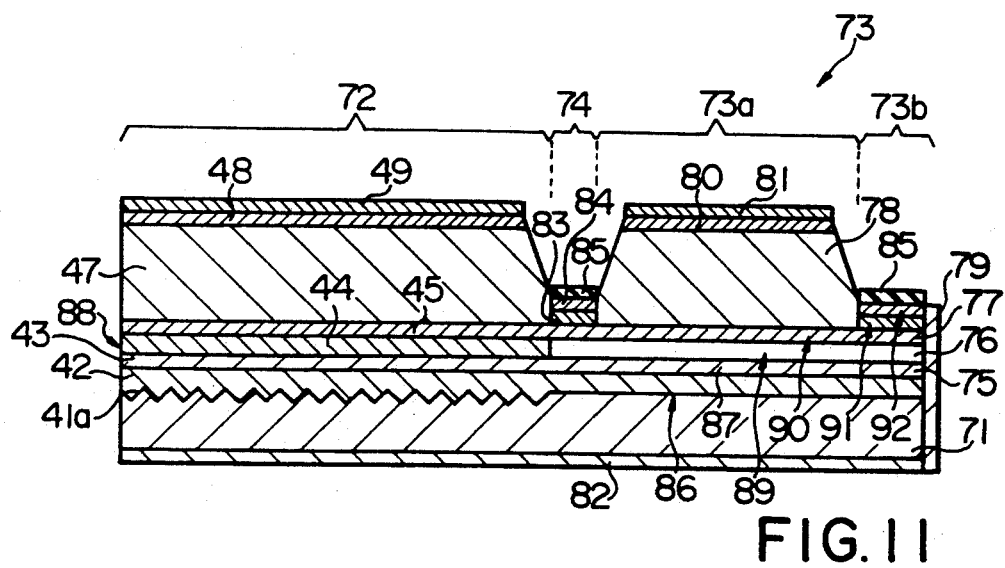
FIG. 11 is a cross sectional view taken along line D—D of FIG. 10 and showing the structure of the integrated optical circuit.

Turning to FIGS. 10 and 11 of the drawings, an integrated optical circuit embodying the present invention is illustrated and fabricated on an n-type InP substrate 71. In this instance, the integrated optical circuit is implemented by a distributed feedback laser emitting device 72 and an optical modulator 73, and an isolator 74 is provided between the distributed feedback laser emitting device 72 and the optical modulator 73.

The distributed feedback laser emitting device is similar to the laser emitting device shown in FIGS. 6 and 7, and the component layers are labeled with references designating the corresponding layers shown in FIGS. 6 and 7.

The optical modulator 73 is implemented by a slab line, and has an optical modulating section 73a and a window section 73b. Namely, the slab line serving as the optical modulator comprises a spacer layer 75 of n-type InP, an optical absorbing layer 76 of intentionally undoped InGaAsP with wavelength composition of about 1.43 microns, a cladding layer 77 of intentionally undoped InP with a ridge 78 epitaxially grown on a part of the cladding layer 77, and a low reflectance coating film 79 provided on the side surface of the slab line. The side surface held in contact with the low reflectance coating film 79 is spaced apart from the side surface of the ridge 78 by about 25 microns. On the upper surface of the ridge 78, a contact layer 80 of heavily doped p-type InGaAs is grown, and an electrode 81 of titanium-gold is held in contact with the contact layer 80. A common electrode 82 of titanium-gold is provided on the bottom surface of the n-type InP substrate 71, and is shared between the distributed feedback laser emitting device 72 and the optical modulator 73. The ridge 78 is substantially aligned with the ridge 47.

The isolator 74 is formed in a multilevel structure, and comprises an etching stopper 83 of intentionally undoped InGaAsP formed on the cladding layer 77, a cladding layer 84 of intentionally undoped InP formed on the etching stopper 83, and a mask layer 85 of silicon dioxide formed on the cladding layer 84. On the window section 73b, is provided another multilevel structure which is similar to the isolator 74. The isolator 74 intervening between the ridges 47 and 78 effectively couples the distributed feedback laser emitting device 72 with the optical modulator 73 with sacrifice of the resistance of the intentionally undoped InP film thereunder. If the dimensions and the impurity concentration thereof are preferably selected, practical communication is established.

Description is hereinbelow made on a process sequence for fabricating the integrated optical circuit. The process sequence starts with preparation of the n-type InP substrate 71 partially provided with a diffraction grating 41a. On the n-type InP substrate 71 are sequentially grown an n-type InGaAsP film 86 with wavelength composition of about 1.15 microns, an n-type InP film 87, an intentionally undoped InGaAsP film 88 with wavelength composition of 1.55 microns, an intentionally undoped InP film which are about 0.3 micron thick, about 0.1 micron thick, about 0.3 micron thick and about 0.3 micron thick, respectively. The n-type InGaAsP film 86 over the diffraction grating 41a serves as the optical guiding layer 42, and the n-type InP film 87 is shared between the spacer layers 43 and 75.

The undoped InP film is removed, and the intentionally undoped InGaAsP film 88 is partially etched away through lithographic techniques. Namely, a silicon dioxide film is deposited over the entire surface of the structure, and is patterned so as to form a quadrilateral mask layer obliquely extending at 6 degrees with respect to (011) orientation of the n-type InP substrate 71. Using the mask layer of silicon dioxide thus patterned, the intentionally undoped InGaAsP film 88 is partially etched away, and the intentionally undoped InGaAsP film 88 left on the spacer layer 43 serves as the active layer 44.

An intentionally undoped InGaAsP film 89 with wavelength composition of about 1.45 microns is selectively grown on the spacer layer 87 exposed through the mask layer of silicon dioxide, and serves as the optical absorbing layer 76 of the optical modulator 73. The mask layer of silicon dioxide is stripped off, and an intentionally undoped InP film 90, an intentionally undoped InGaAsP film 91 and an intentionally undoped InP film 92 are sequentially grown on the entire surface of the structure to respective thicknesses of about 0.05 micron, 0.03 micron and 0.2 micron. The intentionally undoped InP film 90 is shared between the upper cladding layers 45 and 77.

A silicon dioxide film is deposited over the entire surface of the structure again, and is patterned through lithographic techniques so as to form two quadrilateral openings. One of the two quadrilateral openings is substantially overlapped with the active layer 44, and is about 3 micron in width. The other quadrilateral opening is located over the optical absorbing layer 76, and the longitudinal edges of the two quadrilateral openings are substantially aligned with each other as shown in FIG. 10. The other quadrilateral opening is also about 3 microns in width, and the side edge thereof is spaced apart from the side surface held in contact with the low reflectance coating film 79 by about 25 microns. Using the mask layer of silicon dioxide, the intentionally undoped InP film 92 and the intentionally undoped InGaAsP film 91 are patterned through lithographic techniques, and p-type InP and heavily doped InGaAs ares epitaxially grown on the cladding layers 45 and 77 to respective thicknesses of about 0.8 micron and about 0.3 micron. The p-type InP blocks thus epitaxially grown provide the ridges 47 and 78, respectively, and the heavily doped InGaAs films serves as the contact layers 48 and 80, respectively. The intentionally undoped InP film 92 and the intentionally undoped InGaAsP film 91 are left on the intentionally undoped InP film 90, and form in combination the multilevel structures. After the formation of the contact layers 48 and 80, the electrodes 49, 81 and 82 are formed on the respective surfaces.

In this instance, the diffractive feedback laser emitting device 72, the optical modulator 73 and the isolator 74 respectively occupy parts of the real estate of the substrate 71, and the parts of the real estate measure about 750 microns, about 250 microns and about 20 microns along the longitudinal directions thereof. Since the window section 73b is provided in association with the optical modulating section 73a, residual reflection is sufficiently restricted, and the wavelength of the oscillation upon the modulation is extremely small. The integrated optical circuit thus arranged is preferable for an integrated light source incorporated in a long-distance large-capacity optical fiber communication system.

As will be understood from the foregoing description, the ridge epitaxially grown on the upper cladding layer improves the propagation losses, and the ridge structure is widely applicable to various optical devices as well as an integrated optical circuit fabricated therefrom.

Although particular embodiments of the present invention have been shown and described, it will be obvious to those skilled in the art that various changes and modifications may be made without departing from the spirit and scope of the present invention. For example, any optical device with a ridge epitaxially grown on a cladding layer may be incorporated in an integrated optical circuit. Moreover, an integrated optical circuit may have a waveguide with a bending ridge epitaxially grown on a part of an upper cladding layer.

What is claimed is:

1. An optical device fabricated on a substrate of a first compound semiconductor material, comprising a slab line having a) an upper cladding layer with a ridge epitaxially grown on a part of an upper surface thereof defined by a mask layer, b) a lower cladding layer formed of a second compound semiconductor material, and c) a guiding layer sandwiched between said lower cladding layer and said upper cladding layer for guiding light confined therein, and formed of a third compound semiconductor material, said upper cladding layer with said ridge being formed of a fourth compound semiconductor material, said third compound semiconductor material being larger in refractive index than said second and fourth compound semiconductor materials.

2. An optical device fabricated on a substrate of n-type indium phosphide, comprising a slab line having a) an upper cladding layer with a ridge epitaxially grown on a part of an upper surface thereof defined by a mask layer, b) a lower cladding layer formed of a second compound semiconductor material, and c) a guiding layer sandwiched between said lower cladding layer and said upper cladding layer for guiding light confined therein, and formed of a third compound semiconductor material, said upper cladding layer with said ridge being formed of a fourth compound semiconductor material, said third compound semiconductor material being larger in refractive index than said second and fourth compound semiconductor materials.

3. An optical waveguide as set forth in claim 2, in which said second compound semiconductor material, said third compound semiconductor material and said fourth compound semiconductor material are intentionally undoped indium phosphide, intentionally undoped indium gallium arsenide and intentionally undoped indium phosphide, respectively.

4. An optical waveguide as set forth in claim 3, in which said substrate has a diffraction grating so as to allow said slab line to serve as an optical filter.

5. An optical waveguide as set forth in claim 2, in which said second compound semiconductor material, said third compound semiconductor material and said fourth compound semiconductor material are n-type indium phosphide, intentionally undoped indium gallium arsenide and p-type indium phosphide, respectively, and in which said optical waveguide further comprises d) a first electrode held in contact with a bottom surface of said substrate, and e) a contact layer of heavily doped p-type indium gallium arsenide formed on an upper surface of said ridge, and f) a second electrode held in contact with said contact layer, said slab line serving as an optical phase shifter when current is injected to said guiding layer.

6. An optical device fabricated on a substrate of a first compound semiconductor material, comprising a slab line having a) an upper cladding layer with a ridge epitaxially grown on a part of an upper surface thereof defined by a mask layer, b) a lower cladding layer formed of a second compound semiconductor material, and c) an optical absorbing layer sandwiched between said lower cladding layer and said upper cladding layer, and formed of a third compound semiconductor material, said upper cladding layer being formed of a fourth compound semiconductor material, said third compound semiconductor material being larger in refractive index than said second and fourth compound semiconductor materials, and in which said optical device further comprises d) a contact layer formed on said ridge and formed of a fifth compound semiconductor material, e) a first electrode held in contact with said contact layer, and f) a second electrode held in contact with a bottom surface of said substrate, said slab line serving as an optical modulator when an electric field is applied to said optical absorbing layer.

7. An optical waveguide as set forth in claim 6, in which said first compound semiconductor material, said second compound semiconductor material, said third compound semiconductor material, said fourth compound semiconductor material and said fifth compound semiconductor material are n-type indium phosphide, n-type indium phosphide, intentionally undoped indium gallium arsenide, p-type indium phosphide and p-type indium phosphide, respectively.

8. An optical device fabricated on a substrate of a first compound semiconductor material, comprising a slab line having a) an upper cladding layer with a ridge epitaxially grown on a part of an upper surface thereof defined by a mask layer, b) an optical guiding layer of a second compound semiconductor material formed on a diffraction grating of said substrate, c) a spacer layer of a third compound semiconductor material formed on said optical guiding layer, and d) an active layer of a fourth compound semiconductor material formed between said spacer layer and said upper cladding layer of a fifth compound semiconductor material, and in which said optical device further comprises e) a contact layer formed on said ridge and of a sixth compound semiconductor material, f) a first electrode held in contact with said contact layer, and g) a second electrode held in contact with a bottom surface of said substrate, said slab line serving as a distributed feedback laser emitting device when current is injected into said active layer.

9. An optical waveguide as set forth in claim 8, in which said first compound semiconductor material, said second compound semiconductor material, said third compound semiconductor material, said fourth compound semiconductor material, said fifth compound semiconductor material and said sixth compound semiconductor material are n-type indium phosphide, n-type indium gallium arsenide phosphide, n-type indium phosphide, intentionally undoped indium gallium arsenic phosphide, p-type indium phosphide and heavily doped indium gallium arsenide respectively.

10. An optical device fabricated on a substrate of a first compound semiconductor material, comprising a slab line having a) an upper cladding layer with a ridge epitaxially grown on a part of an upper surface thereof defined by a mask layer, b) an optical guiding layer of a second compound semiconductor material formed on said substrate, c) a spacer layer of a third compound semiconductor material formed on said optical guiding layer, and d) an active layer of a fourth compound semiconductor material formed between said spacer layer and said upper cladding layer of a fifth compound semiconductor material, and in which said optical device further comprises e) a contact layer formed on said ridge and formed of a sixth compound semiconductor material, f) a first electrode held in contact with said contact layer, g) a second electrode held in contact with a bottom surface of said substrate, and h) low reflectance coating films respectively covering side surfaces of said slab line, said slab line being divided into a ridge section located between virtual plains substantially coplanar with side surfaces of said ridge and window sections located on both sides of said ridge section, said slab line serving as an optical amplifier when current is injected into said active layer.

11. An optical waveguide as set forth in claim 10, in which said first compound semiconductor material, said second compound semiconductor material, said third compound semiconductor material, said fourth compound semiconductor material, said fifth compound semiconductor material and saiα sixth compound semiconductor material are n-type indium phosphide, n-type indium gallium arsenide phosphide, n-type indium phosphide, intentionally undoped indium gallium arsenic phosphide, p-type indium phosphide and heavily doped p-type indium gallium arsenide, respectively.

12. An optical waveguide as set forth in claim 11, in which each of said virtual planes is spaced apart from said associated side surface of said slab line by about 25 microns.

13. An optical waveguide as set forth in claim 10, in which said ridge is formed in such a manner as to be oblique at not less than 5 degrees with respect to a normal line of a side surface of said substrate.

14. An optical waveguide as set forth in claim 12, in which said ridge has an upper surface of a parallelogram and a bottom surface of a parallelogram, longitudinal edges of said parallelograms being oblique at 6 degrees with respect to (011) orientation of said substrate, said ridge being about 3 micron in width.

15. An optical device fabricated on a substrate of a first compound semiconductor material, comprising a slab line having a) an upper cladding layer with a ridge epitaxially grown on a part of an upper surface thereof defined by a mask layer, b) a lower cladding layer formed of a second compound semiconductor material, and c) a guiding layer sandwiched between said lower cladding layer and said upper cladding layer for guiding light confined therein, and formed of a third compound semiconductor material, said upper cladding layer with said ridge being formed of a fourth compound semiconductor material, said third compound semiconductor material being larger in refractive index than said second and fourth compound semiconductor materials, and in which another slab line with a ridge epitaxially grown on another part of said upper surface of said upper cladding layer is further fabricated on said substrate, an isolator being provided between said ridge of said slab line and said ridge of said another slab line, said slab line and said another slab line forming parts of an integrated optical circuit.

16. An optical waveguide as set forth in claim 15, in which said slab line serves as a distributed feedback laser emitting device, and comprises an optical guiding layer of n-type indium gallium arsenic phosphide formed on a diffraction grating of said substrate, a first spacer layer of n-type indium phosphide formed on said optical guiding layer, an active layer of intentionally undoped indium gallium arsenic phosphide formed on said spacer layer over said diffraction grating, said upper cladding layer with said ridge formed of intentionally undoped indium phosphide on said active layer.

17. An optical waveguide as set forth in claim 16, in which said another slab line serves as an optical modulator, and comprises a second spacer layer contiguous to said first spacer layer and formed of n-type indium phosphide, an optical absorbing layer of intentionally undoped indium gallium arsenic phosphide formed on said second spacer layer, and a cladding layer with a ridge formed of intentionally undoped indium phosphide and contiguous to said upper cladding layer, said ridge being epitaxially grown said cladding layer, a low reflectance coating film being held in contact with a side surface of said another slab line, said ridge of said upper cladding layer and said ridge of said upper cladding layer have respective center axes substantially aligned with each other.

18. An optical waveguide as set forth in claim 17, in which said ridge of said another slab line is spaced apart from said low reflectance coating film so as to form a window section on one side of a ridge section beneath said ridge thereof.

19. A process of fabricating an optical waveguide, comprising the steps of:
 a) preparing a substrate of a first compound semiconductor material;
 b) sequentially growing a second compound semiconductor material, a third compound semiconductor material and a fourth compound semiconductor material on said substrate for providing a guiding layer sandwiched between a lower cladding layer and an upper cladding layer;
 c) providing a mask layer of dielectric substance on an upper surface of said upper cladding layer having an opening exposing a part of said upper surface; and
 d) epitaxially growing said fourth compound semiconductor material on said part of said upper surface for producing a ridge.

* * * * *